United States Patent [19]

Orihara

[11] Patent Number: 5,255,099
[45] Date of Patent: Oct. 19, 1993

[54] SOLID STATE PICKUP DEVICE WITH STRAP LINE IN VERTICAL REGISTER

[75] Inventor: Kozo Orihara, Tokyo, Japan
[73] Assignee: Nec Corporation, Tokyo, Japan
[21] Appl. No.: 822,079
[22] Filed: Jan. 17, 1992

[30] Foreign Application Priority Data

Jan. 23, 1991 [JP] Japan .................................. 3-6307

[51] Int. Cl.⁵ .................... H04N 3/14; H04N 5/335
[52] U.S. Cl. ............... 358/213.23; 358/213.29; 358/213.15; 257/232; 257/249
[58] Field of Search ................ 358/213.23, 213.11, 358/213.15, 213.29; 357/24 LR; 257/232, 249

[56] References Cited

U.S. PATENT DOCUMENTS

| | | | |
|---|---|---|---|
| 4,163,239 | 7/1979 | Carter | 357/24 LR |
| 4,380,056 | 3/1983 | Parrish et al. | 357/24 LR |
| 4,689,687 | 8/1987 | Koike et al. | 357/24 LR |
| 4,740,824 | 4/1988 | Yano et al. | 358/213.11 |
| 4,847,692 | 7/1989 | Tabei | 358/213.11 |
| 4,884,143 | 11/1989 | Uya | 357/24 LR |
| 5,040,038 | 8/1991 | Yutani et al. | 358/213.23 |

FOREIGN PATENT DOCUMENTS

| | | | |
|---|---|---|---|
| 63-275164 | 11/1988 | Japan | 358/213.23 |
| 2-133963 | 5/1990 | Japan | 358/213.23 |

OTHER PUBLICATIONS

Section 13: Image Sensors, Processors, and Displays; Fam 13.2: A 2 Million Pixel Fit-CCD Image Sensor for HDTV Camera System, 1990 IEEE International Solid State Circuits Conference, pp. 214-215, by Kazuya Yonemoto, et al.

Primary Examiner—Joseph Mancuso
Assistant Examiner—Wendy R. Greening
Attorney, Agent, or Firm—Burns, Doane, Swecker & Mathis

[57] ABSTRACT

The solid state, image pickup device of the present invention includes a set of vertical registers. Each of the vertical registers includes a transfer channel and a group of transfer electrodes driven by a vertical driving pulse and formed by crossing the transfer channel, and the group of transfer electrodes includes at least one first transfer electrode and at least one second transfer electrode. Each of the vertical registers includes first contacts which electrically connect the group of transfer electrodes to the intermediate layer of polysilicon and second contacts which electrically connect the intermediate layer of polysilicon to the aluminum wiring layer. The first contacts and the second contacts are respectively formed over the group of transfer electrodes.

7 Claims, 3 Drawing Sheets

SOLID STATE PICKUP DEVICE WITH STRAP LINE IN VERTICAL REGISTER

BACKGROUND OF THE INVENTION

The present invention relates to a solid state image pickup device.

In recent years, the trend in two-dimensional solid state image pickup devices is towards a remarkable increase in the number of picture elements incorporated and the marked advancement of the miniaturization of a chip size, and these changes which have brought about the micronization of wiring patterns In two-dimensional solid state image pick up devices, a vertical driving pulse is generally applied in each transfer electrode of the vertical registers through two layers of aluminum wiring, each of which is electrically connected to the transfer electrode at each end of an image area. However, since each transfer electrode of the vertical registers is usually made up of polysilicon, the micronization of the wiring patterns tends to bring about increased electrical resistance of the transfer electrode and, consequently, the waveform of the vertical driving pulse which is applied to the transfer electrode at both ends of the image area deteriorates as the pulse moves away from the ends to the center of the image area. Since the waveform deterioration of the vertical driving pulse is likely to cause lowered transfer efficiency and a resulting decrease in the amount of electric charge being transferred, it may be one of the factors limiting the acceleration of the transfer velocity.

In order to help solve the problems described in the preceding paragraph, the two-dimensional solid state image pickup device shown in FIG. 1A and FIG. 1B is proposed in the paper which appeared on page 214 of the ISSCC DIGEST OF TECHNICAL PAPERS 1990. This device is of the buried channel type which comprises a sheet of silicon substrate 1 and a buried channel 2 of silicon which has the opposite conductivity type from the silicon substrate 1. The transfer of electrical charge in the vertical direction is achieved by means of a set of vertical registers driven by four phased vertical driving pulses $\Phi_1$–$\Phi_4$. Each vertical register comprises a transfer channel, a group of first-layer transfer electrodes, another group of second-layer transfer electrodes, an intermediate layer of polysilicon, an aluminum wiring layer, a plurality of first contacts and a plurality of second contacts. As an example, the vertical register shown on the extreme right-hand side in FIG. 1A comprises a transfer channel (not shown in the figure for simplicity), a group of first-layer transfer electrodes 10–12, another group of second-layer transfer electrodes 20–22, an intermediate layer 44 of polysilicon, an aluminum wiring layer 64, a plurality of first contacts 30 and a plurality of second contacts 50 (only one or two of each of these contacts are shown in the figure for the sake of simplicity). Both the group of transfer electrodes 10–12 and the other group of transfer electrodes 20–22 are made up of polysilicon and are formed onto the buried layer 2 through a gate oxide layer 3 across the transfer channel shown in FIG. 1B. The intermediate layer 44 is formed onto both the group of transfer electrodes 10–12 and the other group of transfer electrodes 20–22 through a gate oxide layer along the transfer channel. The aluminum wiring layer 64 is formed onto the intermediate layer 44 through a gate oxide layer along the transfer channel and, concurrently, serves as the light shield for the vertical register.

In this vertical register, the first component of the vertical driving pulses $\Phi_1$ is applied to the alternately located half of the group of first-layer transfer electrodes 10, 12. The third component of the vertical driving pulses $\Phi_3$ is applied to the remaining half of the same group of first-layer transfer electrodes 11. The second component of the vertical driving pulses $\Phi_2$ is applied to the alternately located half of the other group of second-layer transfer electrodes 20, 22. The fourth component of the vertical driving pulses $\Phi_4$ is applied to the remaining half of the other group of second-layer transfer electrodes 21.

The application of the first component of the vertical driving pulses $\Phi_1$ to the alternately located half of the group of transfer electrodes 10, 12 is achieved by supplying the first component of the vertical driving pulses $\Phi_1$ from the aluminum wiring layer 64 to each transfer electrode 10, 12 through the intermediate layer 44. This is required to prevent the waveform degradation of the first component of the vertical driving pulses $\Phi_1$. For this reason, the transfer electrode 10 and the intermediate layer 44 are electrically connected by forming one of the first contacts 30 shown in FIG. 1A on the transfer channel and on the transfer electrode 10. Similarly, the transfer electrode 12 and the intermediate layer 44 are electrically connected by forming another one of the first contacts 30 also shown in FIG. 1A on the transfer channel and on the transfer electrode 12. Furthermore, by forming one of the second contacts 50 also shown in FIG. 1A on the transfer channel and on the transfer electrode 21, the intermediate layer 44 and the aluminum wiring layer 64 are electrically connected.

Referring to the vertical register located next to the extreme left-hand side in FIG. 1A, the application of the second component of the vertical driving pulses $\Phi_2$ to the transfer electrode 21 is achieved likewise by electrically connecting the aluminum wiring layer 61 and the transfer electrode 21. Referring to the vertical register located in the center in FIG. 1A, the application of the third component of the vertical driving pulses $\Phi_3$ to the transfer electrode 11 is achieved in a similar manner by electrically connecting the aluminum wiring layer 62 and the transfer electrode 11. Referring to the vertical register located second from the extreme right-hand side in FIG. 1A, the application of the fourth component of the vertical driving pulse $\Phi_4$ to the transfer electrodes 22 is achieved in a similar manner by electrically connecting the aluminum wiring layer 63 and the transfer electrode 22.

The reason why the first component of the vertical driving pulses $\Phi_1$ is supplied from the aluminum wiring layer 64 to the transfer electrode 10 through the intermediate layer 44 is to prevent the occurrence of undesirable effects such as lower transfer efficiency and reduced amount of the transferred electrical charge. To explain in more detail, when the aluminum wiring layer 64 and the transfer electrode 10, which is made up of polysilicon, are electrically connected through the electrical contact on the transfer channel, aluminum and polysilicon are partially alloyed at the junction. Consequently, a potential difference appears between the part of the transfer electrode 10 at the contact and the remaining part of the transfer electrode 10, and this difference results in detrimental effects such as lower transfer efficiency and a reduction of the amount of transferred electric charge.

However, in conventional two-dimensional solid state image pickup devices, one of the first contacts 30 is located on the transfer electrode 10 where the first component of the vertical driving pulses $\Phi_1$ is applied, and one of the second contacts 50 is located on the transfer electrode 21 where the second component of the vertical driving pulses $\Phi_2$ is applied. Therefore, there is a potential for electrical short circuits between the transfer electrode 10 and the transfer electrode 21 for the reasons explained below:

(1) The aluminum wiring layer 64 and the transfer electrode 21 may electrically short circuit to each other. This could occur when the electrode pattern masks are optically misregistrated in the course of chip manufacture or when the second contacts 50 are for some reason not properly aligned with the location off the intermediate layer 44.

(2) The aluminum wiring layer 64 and the transfer electrode 21 may electrically short circuit to each other if electrical breakdown should occur between the intermediate layer 44 and the transfer electrode 21 at the contacts 50 where aluminum and polysilicon could be alloyed.

SUMMARY OF THE INVENTION

An object of the present invention is to provide a solid state image pickup device in which some of the problems that have been existent in conventional devices and described in the preceding section can be solved.

Other objects of the present invention will become obvious from the following description.

In accordance with an aspect of the present invention, there is provided a solid state image pickup device which comprises: a vertical register which includes: a transfer channel, a group of transfer electrodes driven by a vertical driving pulse and formed by crossing the transfer channel, an intermediate layer of polysilicon formed along the transfer channel and onto the group of transfer electrodes, an aluminum wiring layer formed along the transfer channel and onto the intermediate layer of polysilicon first contacts which electrically connect the group of transfer electrodes and the intermediate layer of polysilicon, second contacts which electrically connect the intermediate layer of polysilicon and the aluminum wiring layer; the first contacts and the second contacts being formed on the transfer channel and on the group of transfer electrodes.

BRIEF DESCRIPTION OF THE DRAWINGS

The features and advantages of the invention will become apparent from the following description when taken in conjunction with the accompanying drawings in which.

DESCRIPTION OF THE PREFERRED EMBODIMENTS

Figure 1A:
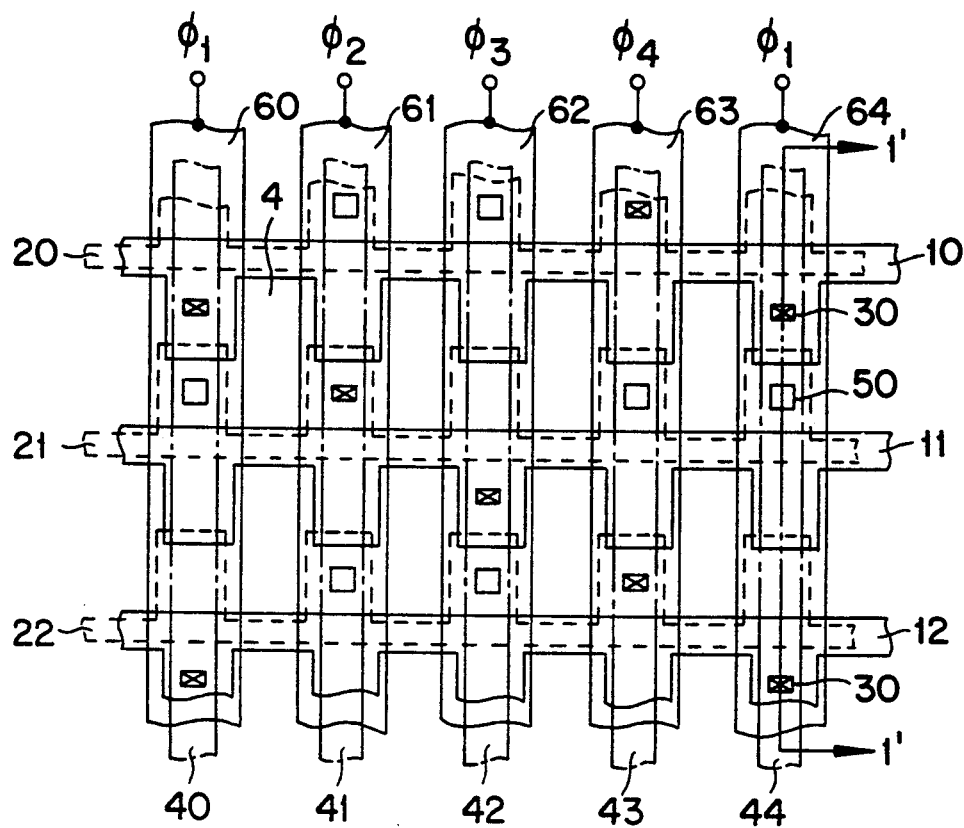
FIG. 1A and 1B are a plan view and a crosssectional view, respectively, of the vertical registers and show the construction of the transfer electrodes of the vertical registers in a conventional solid state image pickup device.
Figure 1B:
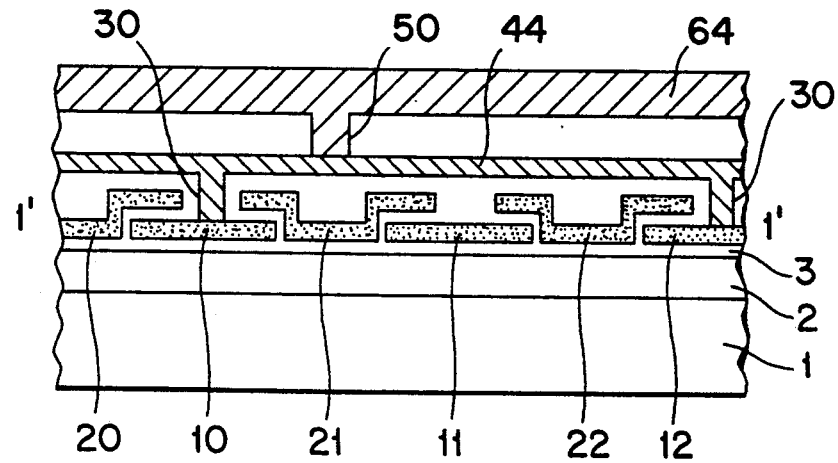
Figure 2:
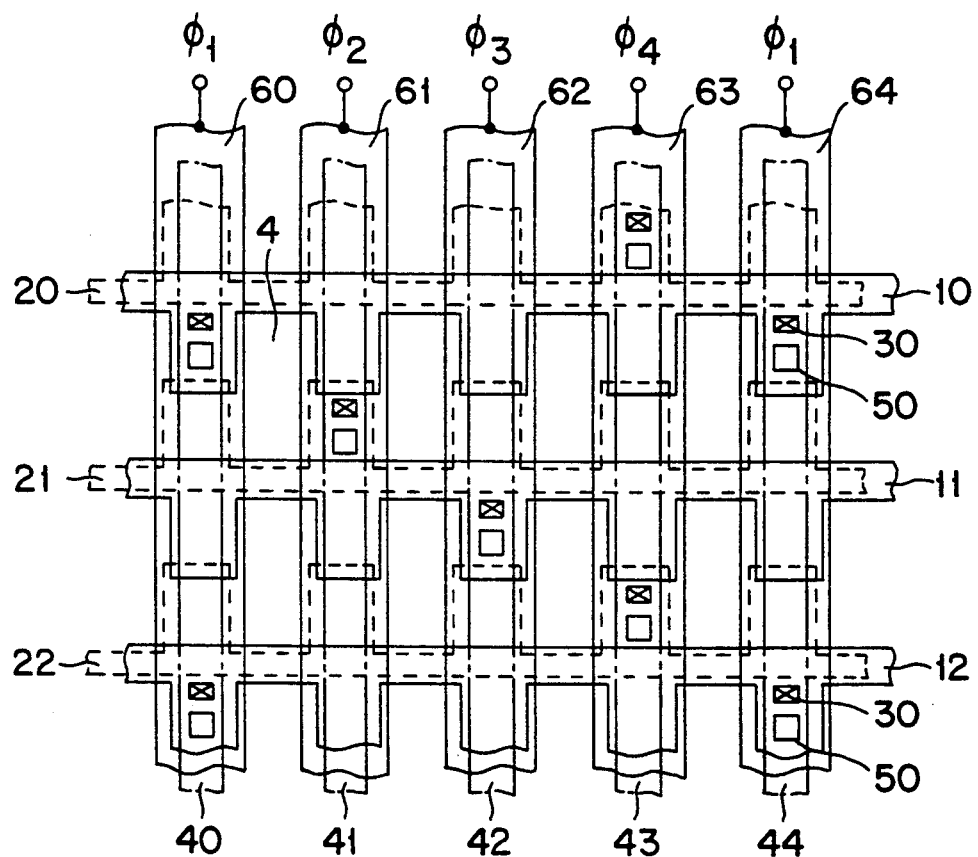
FIG. 2 is a plan view of the first embodiment of the solid state image pickup device of the present invention describing the construction of the transfer electrodes of the vertical registers.

In the first embodiment of the solid state image pickup device of the present invention, first refer to the vertical register shown in the extreme right-hand side in FIG. 2. The aluminum wiring layer 64, to which the first component of the vertical driving pulses $\Phi_1$ is applied, is electrically connected to the first-layer transfer electrode 10 in the following manner:

(1) The transfer electrode 10 is electrically connected to the intermediate layer 44 of, polysilicon by means of one of the first contacts 30 which is provided on the transfer channel (not shown in the figure for simplicity) and also on the transfer electrode 10.

(2) The intermediate layer 44 is electrically connected to the aluminum wiring layer 64 by means of one of the second contacts 50 which is located close to the first contact 30 and is provided on the transfer channel and on the transfer electrode 10.

Consequently, even in the case of the transfer electrode 10 being electrically short circuited at the second contact 50 for the reason mentioned above, an electrical short circuit will not occur between the aluminum wiring layer 64 and the transfer electrode 20 to which the fourth component of the vertical driving pulses $\Phi_4$ is applied. Also, no electrical short circuit can occur between the aluminum wiring layer 64 and the transfer electrode 21 to which the second component of the vertical driving pulses $\Phi_2$ is being applied.

The transfer electrode 10 is likewise electrically connected to the aluminum wiring layer 60, to which the first component of the vertical driving pulses $\Phi_1$ is applied, at the vertical register shown at the extreme left-hand side in FIG. 2. Also, the transfer electrode 12 of the first layer is electrically connected at the vertical registers shown in the extreme left-hand side and in the extreme right-hand side in FIG. 2 to the aluminum wiring layers 60 and 64, respectively, in a manner similar to the connections of the transfer electrode 10. The first component of the vertical driving pulses $\Phi_1$ is applied to both of these aluminum wiring layers. Consequently, in the case of the present embodiment of the solid state image pickup device, each of the alternately located half of the group of transfer electrodes to which the first component of the vertical driving pulses $\Phi_1$ is applied is electrically connected to the aluminum wiring layer through the intermediate layer of polysilicon at every four picture elements horizontally and at every two picture elements vertically.

Similarly, the aluminum wiring layer 61, to which the second component of the vertical driving pulses $\Phi_2$ is applied at the vertical register located next to the extreme left-hand side in FIG. 2 , and the second-layer transfer electrode 21 can be electrically connected. The electrical connection is made in a similar manner at the vertical register located in the center in FIG. 2 between the first-layer transfer electrode 11 and the aluminum wiring layer 62 to which the third component of the vertical driving pulses $\Phi_3$ is applied. The electrical connection is made in the similar manner at the vertical register located next to the extreme right-hand side in FIG. 2 between the second-layer transfer electrode 22 and the aluminum wiring layer 63 to which the fourth component of the vertical driving pulses $\Phi_4$ is being applied.

In the case of the second embodiment of the solid state image pickup device of the present invention shown in FIG. 3, the first-layer transfer electrode 10 and the aluminum wiring layer 68 to which the first component of the vertical driving pulses $\Phi_1$ is applied are electrically connected in the following manner:

(1) The transfer electrode 10 is electrically connected to the intermediate layer 48 of polysilicon by means of one of the first contacts 30 which is formed on the transfer channel (not shown in the figure for simplicity) and also on the transfer electrode 10.

(2) The intermediate layer 48 is electrically connected to the aluminum wiring layer 68 by means of one of the second contacts 50 which is formed just below the aluminum wiring layer 68 on the transfer channel and also on the first-layer transfer electrode 12.

(3) The transfer electrode 10 is likewise electrically connected to the aluminum wiring layer 60 to which the first component of the vertical driving pulses $\Phi_1$ is being applied.

Thus, even when there is an electrical short circuit between the transfer electrode 12 and the aluminum wiring layer 68 at the second contact 50, no electrical short circuits will occur between the aluminum wiring layer 68 and the transfer electrode 22 to which the fourth component of the vertical driving pulses $\Phi_4$ is applied or between the aluminum wiring layer 68 and the second-layer transfer electrode 23 to which the second component of the vertical driving pulses $\Phi_2$ is being applied.

Figure 3:
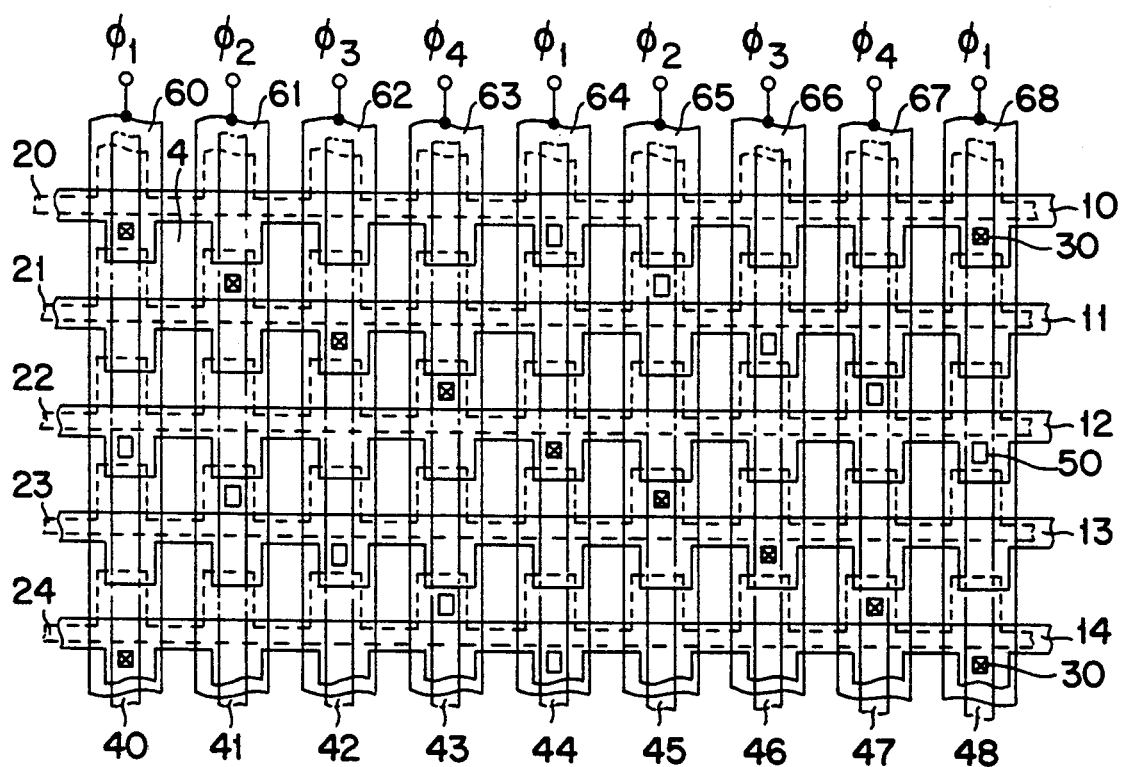
FIG. 3 is a plan view of the second embodiment of the solid state image pickup device of the present invention describing the construction of the transfer electrodes of the vertical registers.

Similarly, in the vertical register shown at the center in FIG. 3, the first-layer transfer electrode 12 is electrically connected to the aluminum wiring layer 64 to which the first component of the vertical driving pulses $\Phi_1$ is being applied. As shown at the extreme left-hand side and at the extreme right-hand side in FIG. 3, the first-layer transfer electrode 14 is electrically connected to the aluminum wiring layers 60, 68 to each of which the first component of the vertical driving pulses $\Phi_1$ is applied. This is similar to the case of transfer electrode 10. Consequently, in the present embodiment of the solid state image pickup device, each of the alternately located half of the group of first-layer transfer electrodes, to which the first component of the vertical driving pulses $\Phi_1$ is applied, is electrically connected to the aluminum wiring layer through the intermediate layer of polysilicon at every eight picture elements horizontally and at every four picture elements vertically.

The group of aluminum wiring layers (the aluminum wiring layers 61, 65, etc.), to each of which the second component of the vertical driving pulses $\Phi_2$ is applied, and the alternately located half of the group of second-layer transfer electrodes (the transfer electrodes 21, 23, etc.) can be similarly connected electrically. Also, the other group of aluminum wiring layers (the aluminum wiring layers 63, 67, etc.), to each of which the fourth component of the vertical driving pulses $\Phi_4$ is applied, and the remaining half of the group of second-layer transfer electrodes (the transfer electrodes 22, 24, etc.) can be similarly connected electrically.

Although the explanations given above are concerned with solid state image pickup devices incorporating vertical registers with four phased drives, any solid state image pickup devices incorporating vertical registers designed to be used with other than four phased drives, e.g. two phased drives, could also be employed with success.

While this invention has been described in conjunction with the preferred embodiments thereof, it would now be possible for any person skilled in the art to readily put this invention into practice in various other ways.

What is claimed is:

1. A solid state image pickup device, comprising:
   at least one vertical register which includes:
   a transfer channel,
   a group of transfer electrodes driven by a vertical driving pulse and formed by crossing said transfer channel, said group of transfer electrodes including at least one first transfer electrode and at least one second transfer electrode,
   an intermediate layer of polysilicon formed along said transfer channel and over said group of transfer electrodes,
   an aluminum wiring layer formed along said transfer channel and over said intermediate layer of polysilicon,
   at least one first contact connecting electrically at least one transfer electrode of said group transfer electrodes and said intermediate layer of polysilicon, and
   at least one second contact connecting electrically said intermediate layer of polysilicon and said aluminum wiring layer,
   wherein for said at least one vertical register at least one said first contact is respectively formed over one of one said first transfer electrode and one said second transfer electrode and at least one said second contact is respectively formed over one of one of said first transfer electrode and one said second transfer electrode driven by a vertical driving pulse of the same phase.

2. A solid state image pickup device according to claim 1, wherein one said first contact and one said second contact are both formed over the same transfer electrode in said group of transfer electrodes.

3. A solid state image pickup device according to claim 1, wherein only either one said first contact or one said second contact is formed over one transfer electrode in said group of transfer electrodes.

4. A solid state image pickup device according to claim 3, wherein at least one said first contact and at least one said second contact for at least one vertical register are formed alternately with only one of either said first contact or said second contact being formed over any one transfer electrode in said group of transfer electrodes.

5. A solid state image pickup device according to any one of claims 1 through 4, wherein each transfer electrode of said group of transfer electrodes includes polysilicon, respectively.

6. A solid state image pickup device according to any one of claim 1 through 4, wherein said at least one vertical register is driven by one of four phased driving pulses.

7. A solid state image pickup device according to claim 5, wherein said at least one vertical register is driven by one of four phased driving pulses.

* * * * *